(12) United States Patent
Tang et al.

(10) Patent No.: US 11,929,567 B2
(45) Date of Patent: Mar. 12, 2024

(54) CARD EDGE CONNECTOR WITH IMPROVED ARRANGEMENT OF SOLDERING PORTIONS OF TERMINALS THEREOF

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Wen-Jun Tang, Kunshan (CN); Tian Yang, Kunshan (CN)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 117 days.

(21) Appl. No.: 17/583,410

(22) Filed: Jan. 25, 2022

(65) Prior Publication Data

US 2022/0247107 A1    Aug. 4, 2022

(30) Foreign Application Priority Data

Feb. 2, 2021    (CN) .......................... 202110144111.X (51) Int. Cl.
*H01R 12/73*    (2011.01)
*H01R 12/70*    (2011.01)
(Continued)

(52) U.S. Cl.
CPC ......... *H01R 12/737* (2013.01); *H01R 12/707* (2013.01); *H01R 13/6471* (2013.01); *H01R 13/6273* (2013.01)

(58) Field of Classification Search
CPC .. H01R 12/737; H01R 12/712; H01R 12/714; H01R 12/716; H01R 12/73;
(Continued)

(56) References Cited

U.S. PATENT DOCUMENTS 8,215,994 B2 * 7/2012 Duenas .............. H01R 13/6471
439/637
9,178,319 B2 * 11/2015 Little ................. H01R 13/6585
(Continued)

FOREIGN PATENT DOCUMENTS

CN    208444979 U    1/2019
CN    107658585 B    8/2019

*Primary Examiner* — Marcus E Harcum
(74) *Attorney, Agent, or Firm* — Ming Chieh Chang (57) ABSTRACT

A card edge connector includes an insulative housing and two rows of terminals. The insulative housing includes two side walls. The terminals include signal terminals and grounding terminals each having a retaining portion, a contact portion, and a soldering portion. Two adjacent terminals in each row constitutes a terminal pair. The soldering portions of each terminal pair are aligned with each other in a longitudinal direction and the soldering portions of an adjacent terminal pair are deviate from each other in the longitudinal direction so that the soldering portions of the two rows of the terminals are arranged in four rows. The terminal pairs include three types of arrangement and in each arrangement the soldering portions of the ground terminals are placed next to the soldering portions of the signal terminals in the closest way in order to reduce interference during transmission.

2 Claims, 13 Drawing Sheets

(51) Int. Cl.
*H01R 13/6471* (2011.01)
*H01R 13/627* (2006.01)

(58) Field of Classification Search
CPC .. H01R 12/721; H01R 12/735; H01R 12/707;
H01R 13/6471; H01R 13/6273
USPC .................................................. 439/637, 65
See application file for complete search history.

(56) References Cited

U.S. PATENT DOCUMENTS

| | | | | |
|---|---|---|---|---|
| 9,780,512 | B2* | 10/2017 | Hsu | H01R 13/641 |
| 9,941,621 | B2* | 4/2018 | Tang | H01R 12/714 |
| 9,966,679 | B2* | 5/2018 | Xu | H01R 12/721 |
| 10,535,929 | B2* | 1/2020 | Ju | H01R 12/721 |
| 2003/0203679 | A1* | 10/2003 | Bu | H01R 12/721 |
| | | | | 439/637 |
| 2008/0200051 | A1* | 8/2008 | Kolivoski | H01R 12/721 |
| | | | | 439/135 |
| 2009/0017681 | A1* | 1/2009 | Amleshi | H01R 13/6471 |
| | | | | 439/607.05 |
| 2011/0034055 | A1* | 2/2011 | Yao | H01R 12/7011 |
| | | | | 439/329 |
| 2013/0252449 | A1* | 9/2013 | Tang | H01R 12/721 |
| | | | | 439/325 |
| 2013/0316585 | A1* | 11/2013 | McGrath | H01R 13/6471 |
| | | | | 439/629 |
| 2018/0212362 | A1* | 7/2018 | Wang | H01R 43/26 |
| 2019/0190212 | A1* | 6/2019 | Fang | H01R 13/646 |
| 2020/0014136 | A1* | 1/2020 | Jiang | H01R 12/721 |

* cited by examiner

CARD EDGE CONNECTOR WITH IMPROVED ARRANGEMENT OF SOLDERING PORTIONS OF TERMINALS THEREOF

BACKGROUND OF THE DISCLOSURE

1. Field of the Disclosure

The present disclosure relates to a card edge connector, and more particularly to an arrangement of soldering portions of terminals retained in the connector.

2. Description of Related Arts

China Patent Application Publication No. 107658585 discloses a card edge connector including a longitudinal insulative housing with a mating slot, a first pair of terminals and a second pair of terminals The first and second pairs are arranged one by one a same side of the mating slot. Two first legs of the first pair are offset from corresponding first contact portions in a first direction of a transverse direction while two second legs of the second pair are offset from corresponding second pair in a second direction of the transverse direction opposite the first direction. The first and second contacting portions are lined in the longitudinal direction. The first legs are arranged on opposite sides of first main portions of the first pair in the transverse direction. The second legs are arranged on opposite sides of second main portions of the second pair in the transverse direction. The first and second pairs of terminals are signal terminals, signal crosstalk between them is serious.

An improved arrangement of terminals is desired to reduce the resonances producing by the signal terminals and enhance high frequency performance of the card edge connector.

SUMMARY OF THE DISCLOSURE

An card edge connector comprises: a longitudinal insulative housing comprising two longitudinal side walls with a card slot between the side walls; two rows of terminals arranged on the side walls, each row of terminals comprising plural signal terminals and plural grounding terminals, each terminal comprising a retaining portion fixed in the insulative housing, a contact portion upwardly extending into the card slot, and a soldering portion downwardly extending out of the insulative housing, the contacting portions of each row of terminals being lined in a longitudinal direction and the soldering portions of each row of terminals being divided into two rows in a transverse direction perpendicular to the longitudinal direction, the soldering portions of the terminals being of a pin-shaped structure, wherein each row of terminals is arranged with plural pairs of first terminals, and each pair consists of one signal terminal and one grounding terminal adjacent to each other and the two soldering portions of each pair.

The soldering portions of the grounding terminals are placed next to the soldering portions of the signal terminals in the closest way so as to reduce crosstalk between the signal terminals and improve high-frequency performance of the card edge connector.

Other objects, advantages and novel features of the disclosure will become more apparent from the following detailed description when taken in conjunction with the accompanying drawings.

DETAILED DESCRIPTION OF THE PREFERRED EMBODIMENT

Referring to FIGS. 1-7 illustrating a card edge connector 100 soldered to a circuit board (PCB) 200 with a card module 300 inserted into the connector to transmit DDR5 signals. In traditional connectors, terminals of pin type soldering portions can not reach a high frequency performance of connectors with Surface Mount Technology (SMT) soldering portions. Therefore, a new arrangement of the pin type soldering portions of a DDR5 socket or card edge connectors is proposed.

Figure 1:
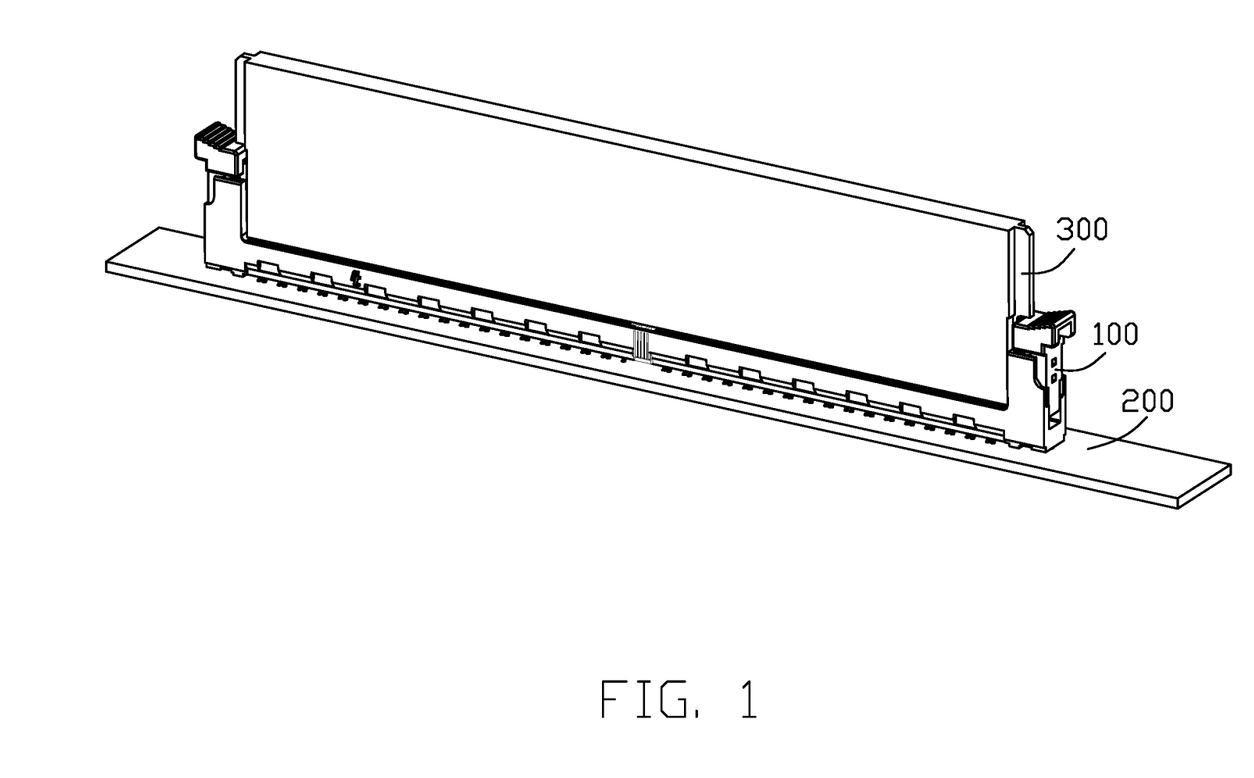
FIG. 1 is a perspective view of a card edge connector mounted on a circuit board and with a card module received in the card edge connector according to a first embodiment of the present invention.
Figure 2:
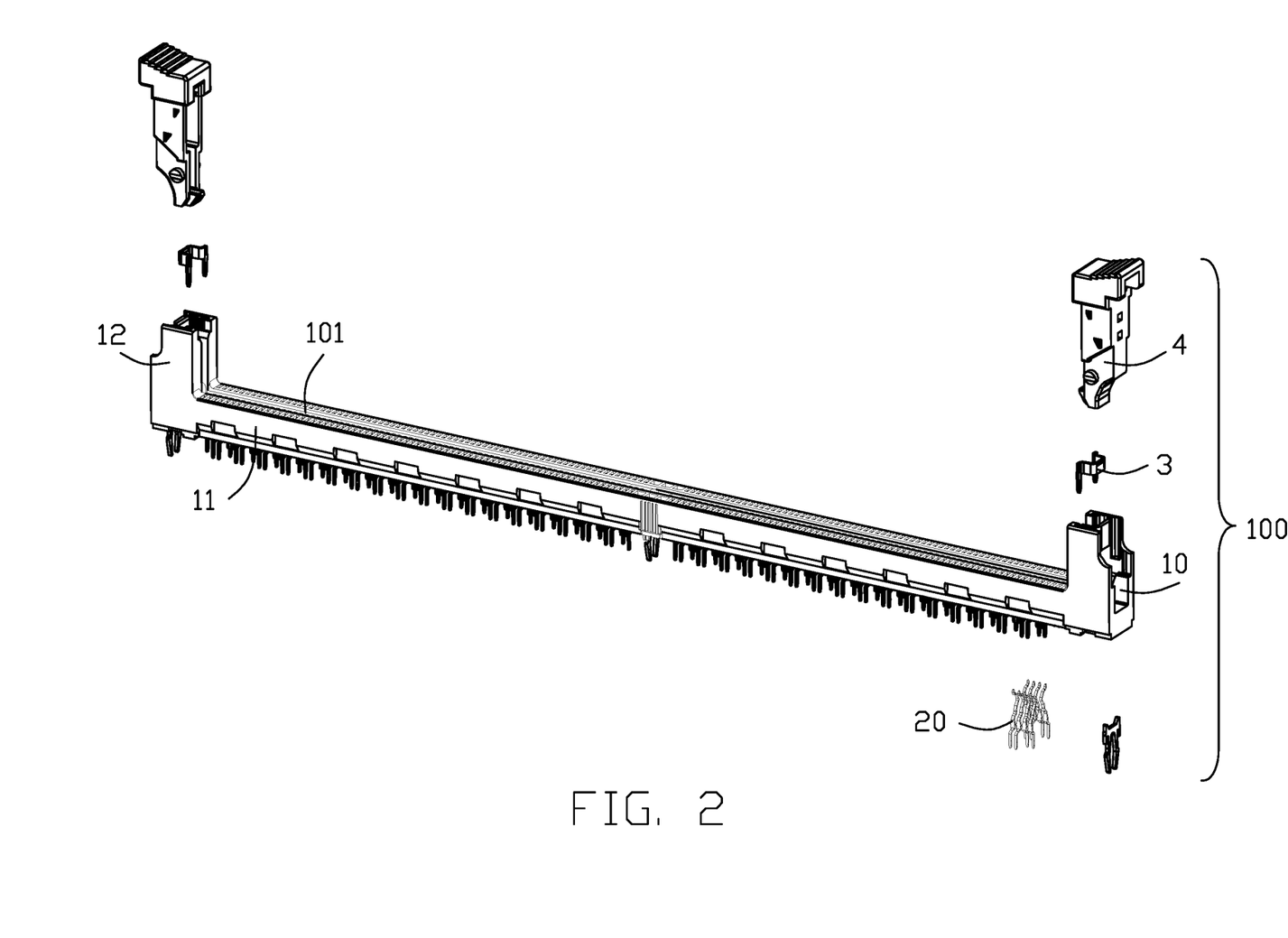
FIG. 2 is an exploded perspective view of the card edge connector of FIG. 1.

Referring to FIGS. 1-2, the card edge connector 100 includes an insulative housing 10 which includes two longitudinal side walls 11 in a longitudinal direction, two tower portions 12 at opposite longitudinal ends of the insulative housing 10 and two rows of terminals in the housing, and defines a card slot 101 between the two side walls 11. A metal member 3 is mounted on each tower portion 12 and a rotatable locking member 4 is pivoted on the tower portion 12. The locking member 4 rotates inward to lock the card module 300 and outwards to release and reject the card module 300 out. The metal members 3 are used to enhance a strength of the tower portions 12 and prolongs the life of the tower portion 12.

Figure 4:
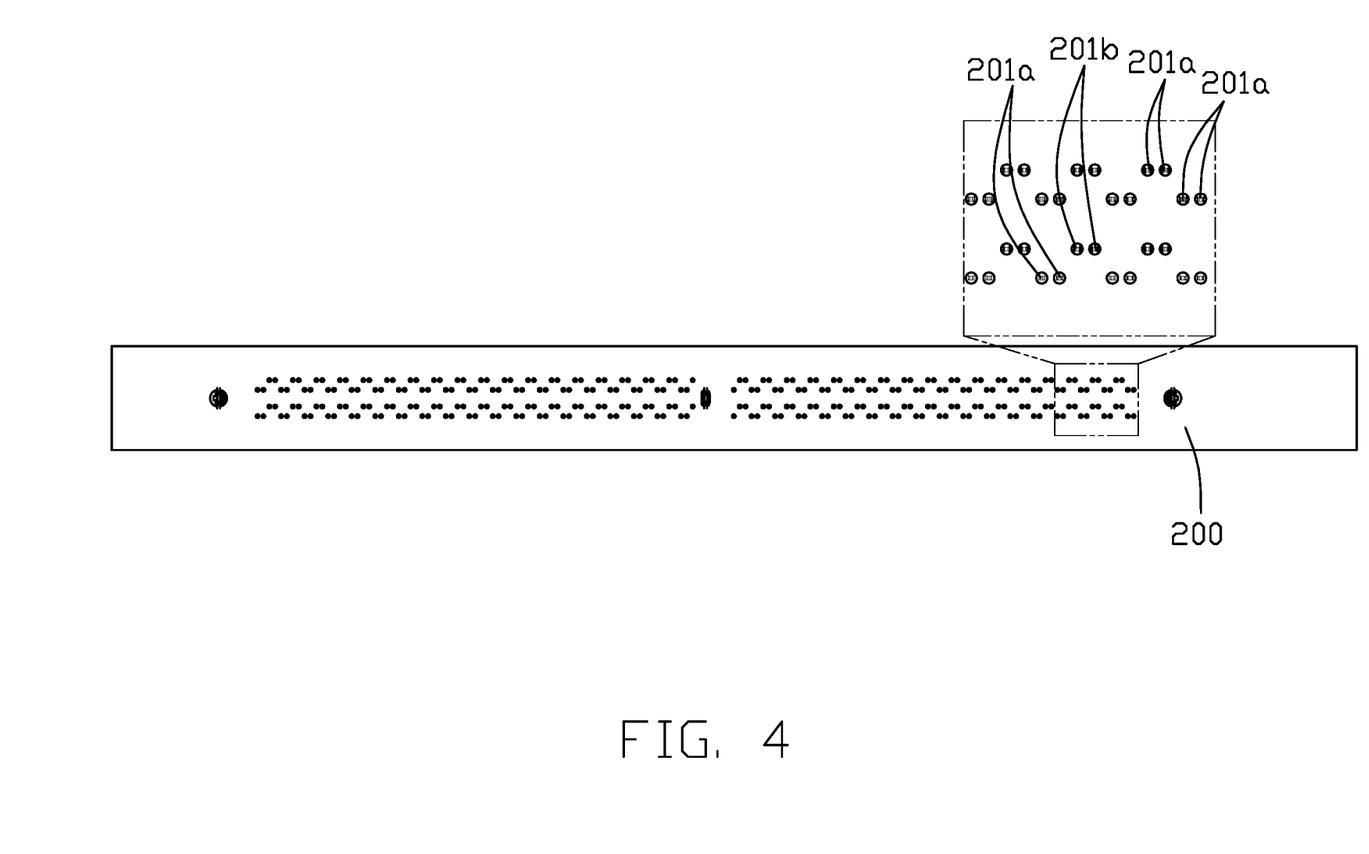
FIG. 4 is a top perspective view of FIG. 3.
Figure 5:
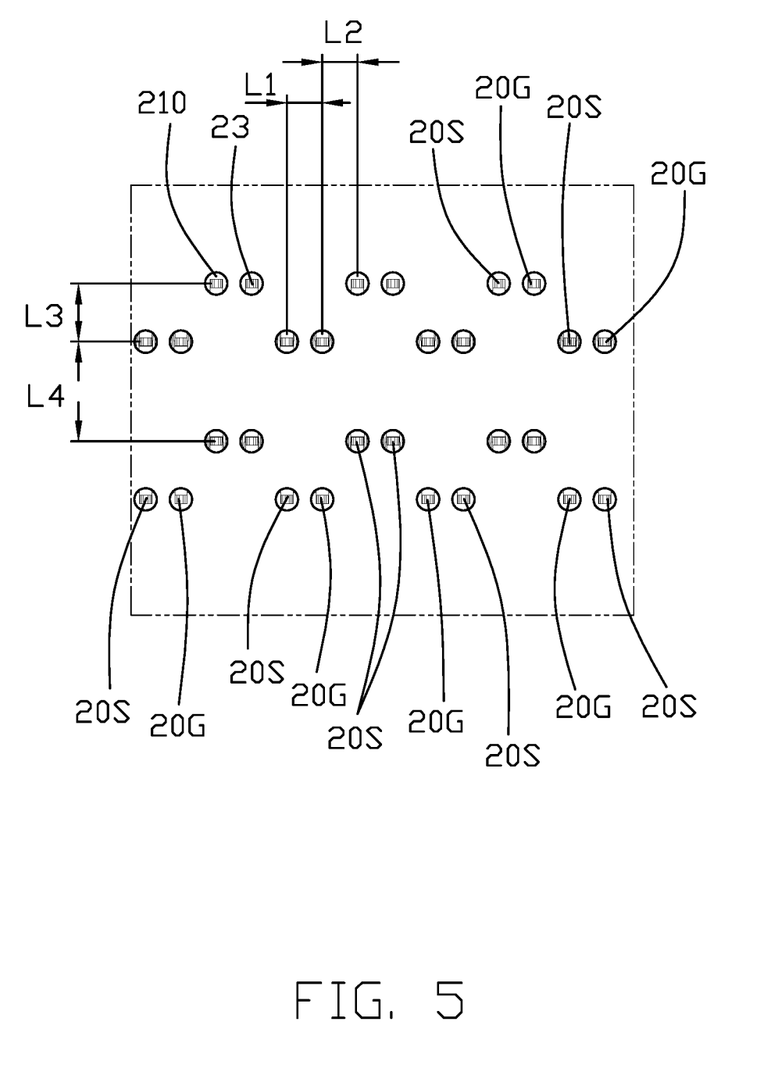
FIG. 5 is an enlarged view of FIG. 4.
Figure 6:
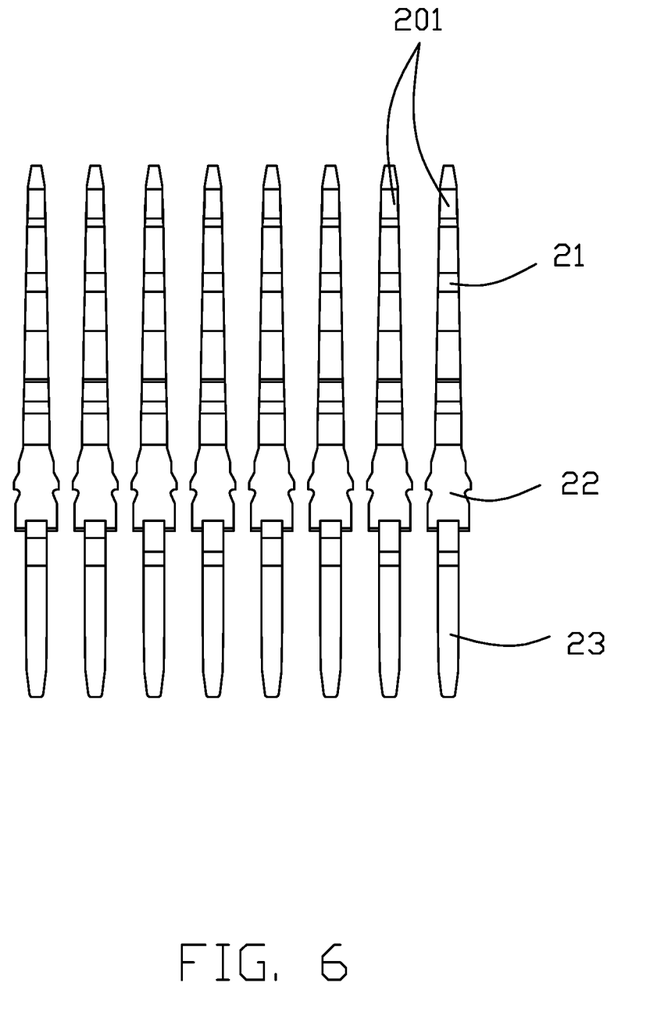
FIG. 6 is a front perspective view of several adjacent terminals.
Figure 7:
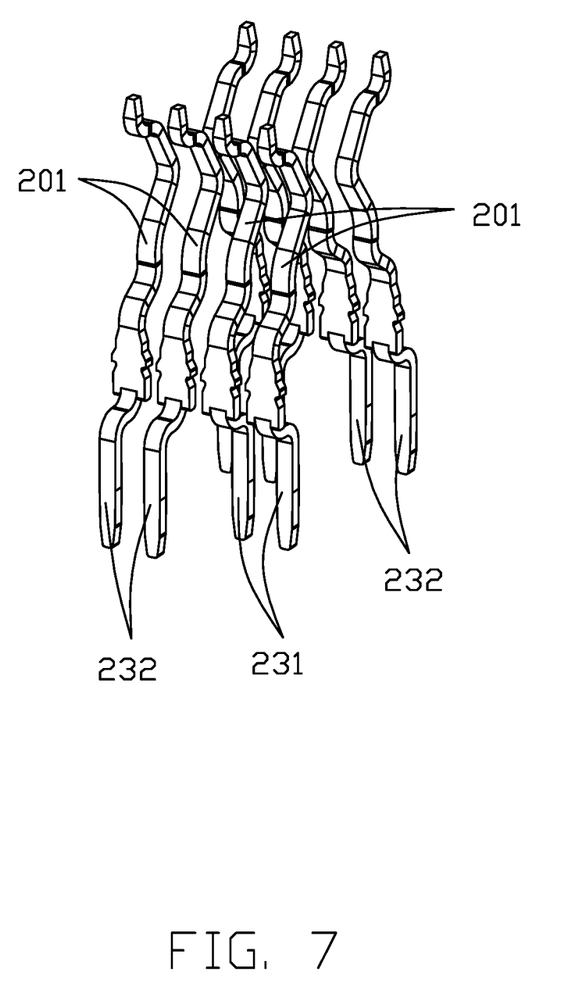
FIG. 7 is a perspective view of several adjacent terminals.

Referring to FIGS. 3-7, two rows of terminals 20 are retained in the corresponding side walls 11 and each row includes a plurality of signal terminals 20S and a plurality of grounding terminals 20G. The signal terminals and the grounding terminals are arranged at intervals. Each terminal 20 includes a retaining portion 22 fixed in the insulative housing 10, a contact portion 21 extending upward from the retaining portion 22 and exposed in the card slot 101, and a soldering portion 23 extending downward from the retaining portion 22 and exposed out of the insulative housing 10 to be mounted on the PCB. The contacting portions 21 of each row of terminals 20 are lined in the longitudinal direction. The soldering portions 23 are of a pin-shaped structure, as shown in FIGS. 6-7, which are adapted for go into or go across holes 210 defined on the circuit board 200. Two adjacent terminals 20 in each row are constructed as a terminal pair 201, the two soldering portions 23 of each terminal pair 201 are aligned with each other in the longitudinal direction, while the soldering portions 23 of the adjacent pairs are deviate from each other in the longitudinal direction, so that the soldering portions 23 of the two rows of the terminals are arranged in four rows.

Figure 3:
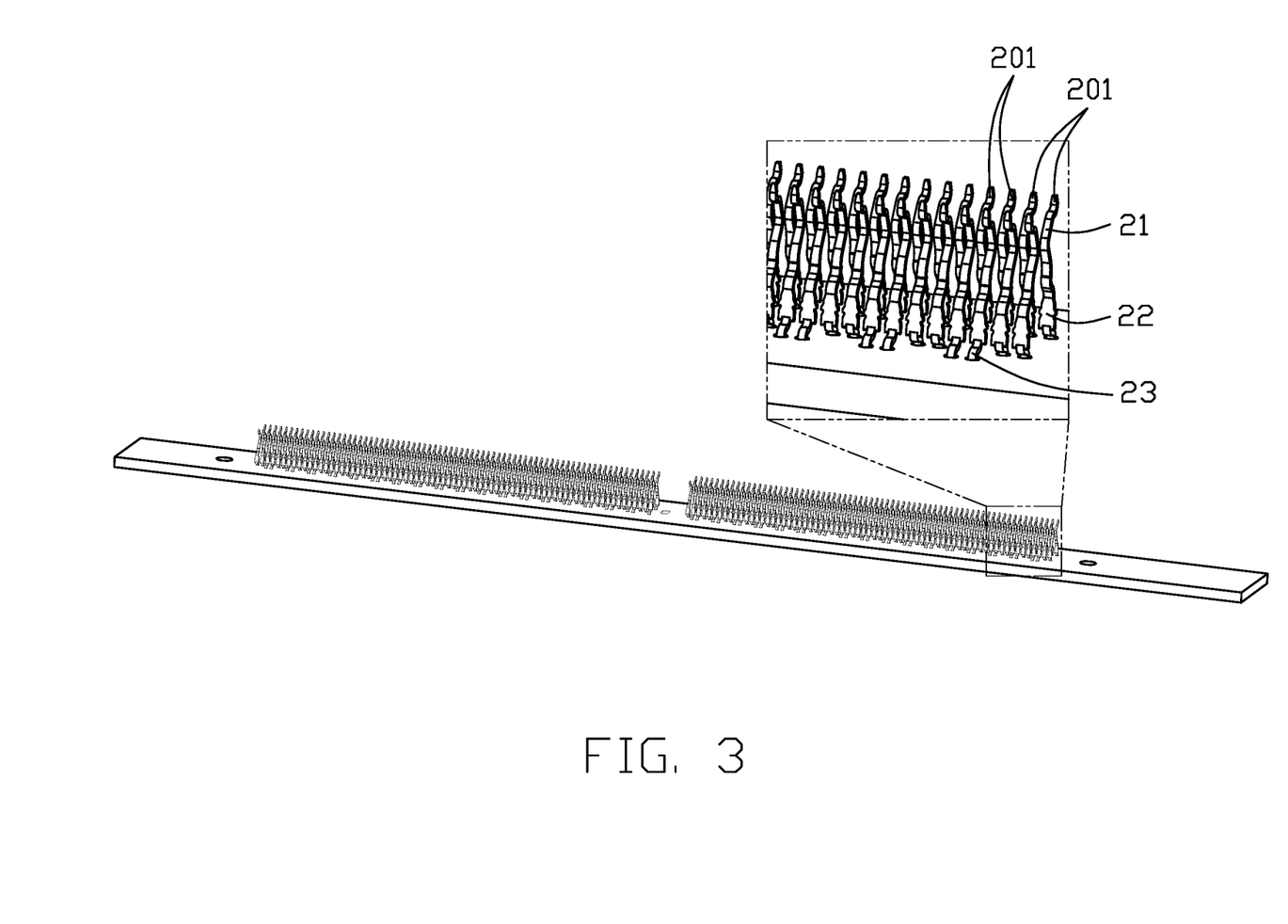
FIG. 3 is a perspective view of the terminals mounted on the circuit board.

In this first embodiment as best shown in FIGS. 3-7, the terminals comprises a large numerals of first terminal pairs 201a and several second terminal pairs 201b which are composed of two adjacent signal terminals 20S. the terminal pairs 201a is from an leftmost to rightmost terminals as shown in FIG. 5 along the longitudinal direction. Referring to FIGS. 3-5, the terminals 20 divide into a left group and a right group in the longitudinal direction at two area. In the left terminal group, the first terminals 201a begin to form from the left first terminals along the longitudinal direction, in the right group, the first terminal pairs begin to form the right first terminal. Notably, a second terminal pair 201b is located between said two adjacent first terminals pairs 201a, one single soldering portion may remain in the last one of each rows.

In said arrangement of the terminals, it is understandingly and hoped, a signal terminal 20S can be companied with one grounding terminal 20G adjacent the signal terminals. Due to the larger numeral of terminal, some terminal pairs are in the form of the second terminal pair to work in with the first terminal pairs. Alternatively, the second terminal pair alternatively consist of two adjacent grounding terminals 20G. In this way, the soldering portions 23 of the grounding terminal 20G are placed next to the soldering portions 23 of the signal terminal 20S in the closest way, in order to reduce the crosstalk producing by the transmission.

Referring to FIGS. 5-7, a second longitudinal distance L2 between the adjacent soldering portions of the adjacent terminal pairs in the longitudinal direction is equal to a first longitudinal distance L1 between two soldering portions of the each terminal pair 201. The second longitudinal distance L2 is smaller than a first transverse distance L3 between adjacent soldering portions of each rows of terminals in the transverse direction perpendicular to the longitudinal direction. Specifically, the soldering portions of adjacent terminal pairs in each row include a row of first soldering portions 231 located on the inner side and a row of second soldering portions 232 located on the outer side in the lateral direction respectively. The retaining portions 22 of the terminals of each row are arranged in a row along the longitudinal direction, and the contact portions 21 of the terminals of each row are arranged in a row along the longitudinal direction.

The first distance L1 is 0.85 millimeters (mm). The distance L3 is 1.4 mm. The fourth distance L4 is 2.4 mm. Understandingly, the distance between the two rows of terminals 20 is increased, to reduce signal interference. The circuit board 200 has a first hole 210 corresponding to each soldering portion, and the inner diameter of the first hole 210 is 0.54 mm. On one hand, the diameter of the first hole 210 ensures the safety distance between the first holes 210 and ensures the spacing for soldering, on the other hand, reduces the capacitance effect of the first hole 210 to improve the high frequency performance. In other embodiments, the distance between the soldering portions 23 can be adjusted according to the actual situation to meet the needs of the actual process. The size of the first hole 210 and the material of the circuit board can be adjusted according to the actual needs too.

Figure 8:
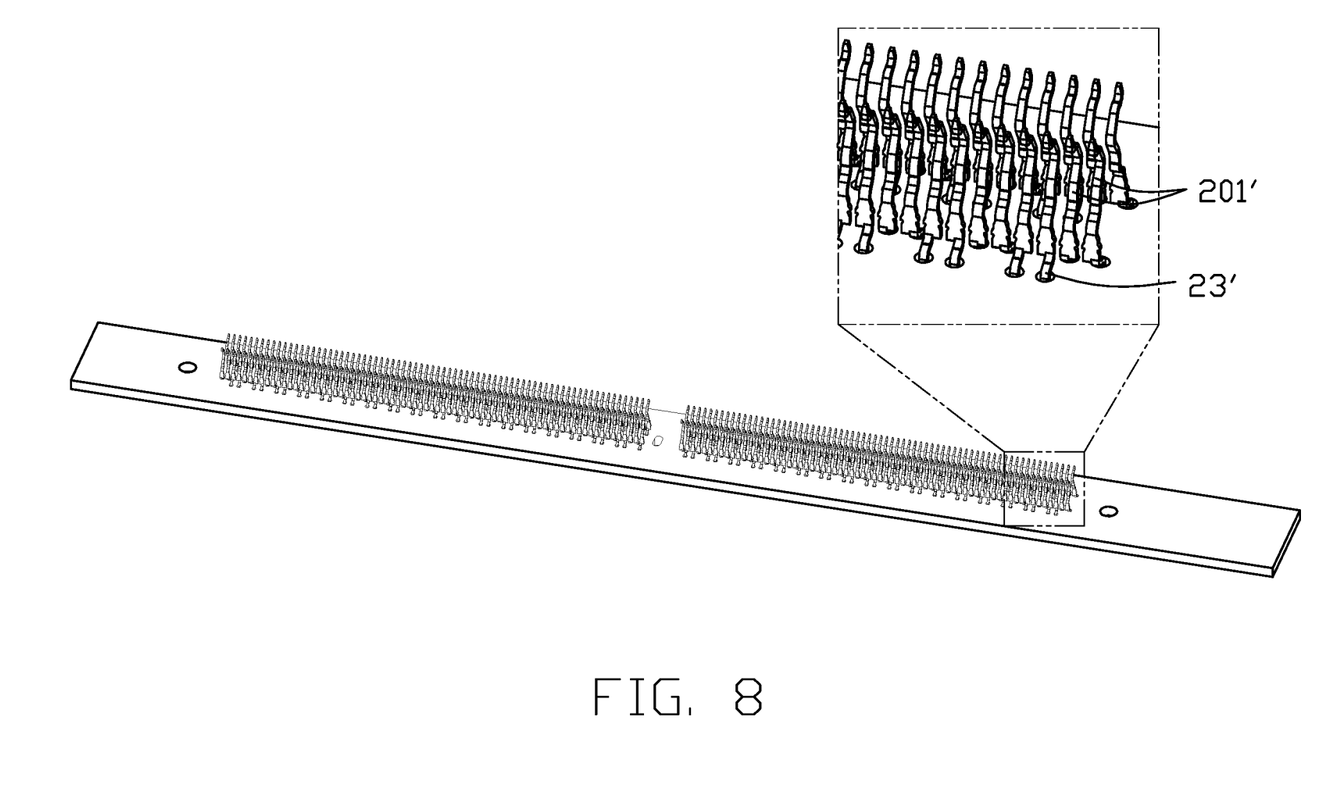
FIG. 8 is a perspective view of the terminals mounted on the circuit board according to a second embodiment of the present invention.
Figure 9:
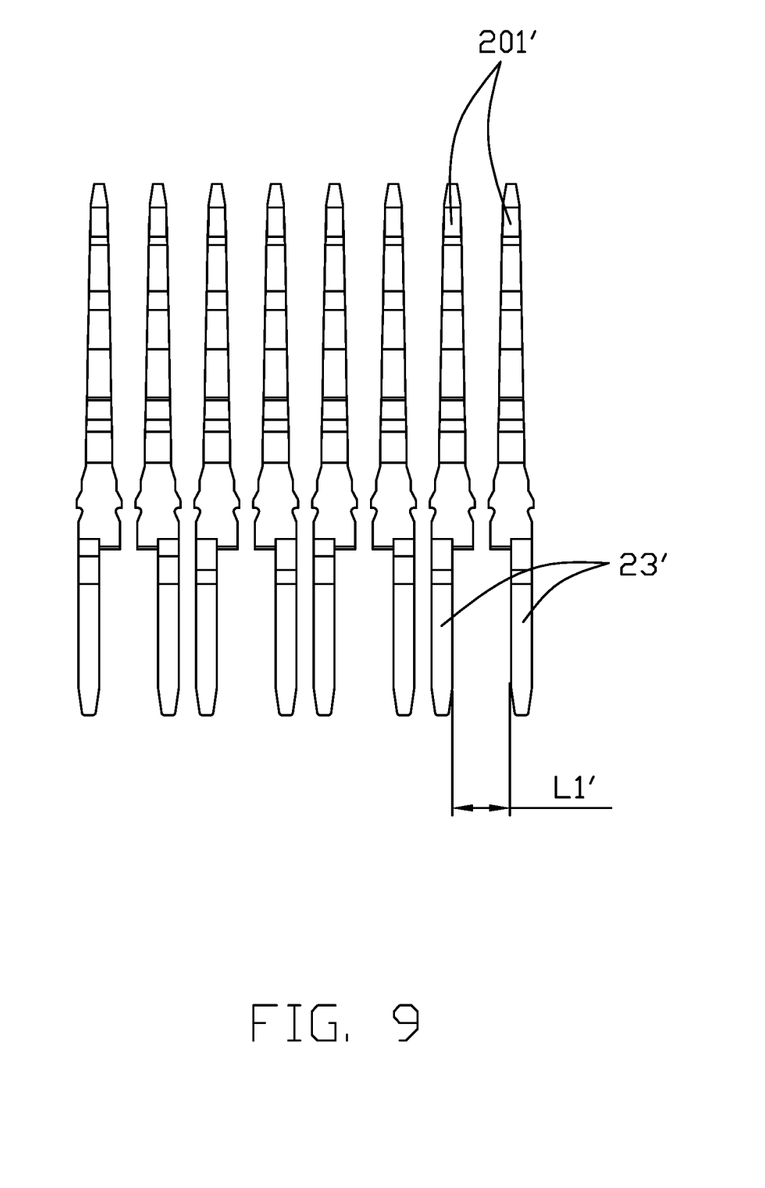
FIG. 9 is a front perspective view of several adjacent terminals according to the second embodiment.
Figure 10:
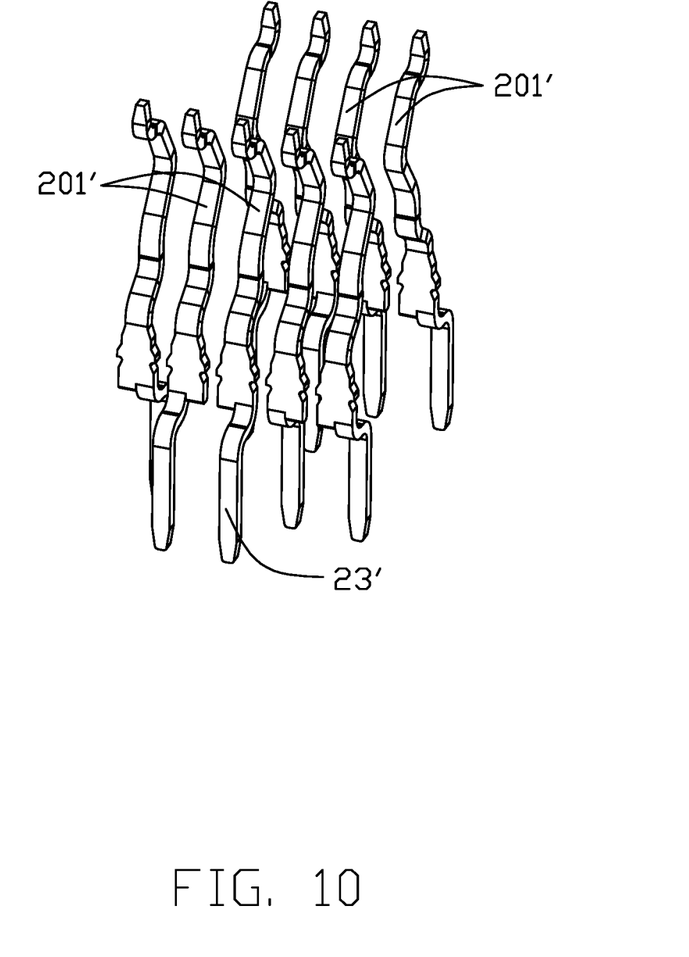
FIG. 10 is a perspective view of several adjacent terminals according to the second embodiment.

Referring to FIGS. 8-10 of the second embodiment, the difference is that the solder portions 23' of each terminal pair 201' are offset relative to the center line of the terminals so as to increase the distance L1' between the soldering portions 23' of the same terminal pair, in order to ensure a safety distance on the PCB circuit board and improve the high frequency performance.

Figure 11:
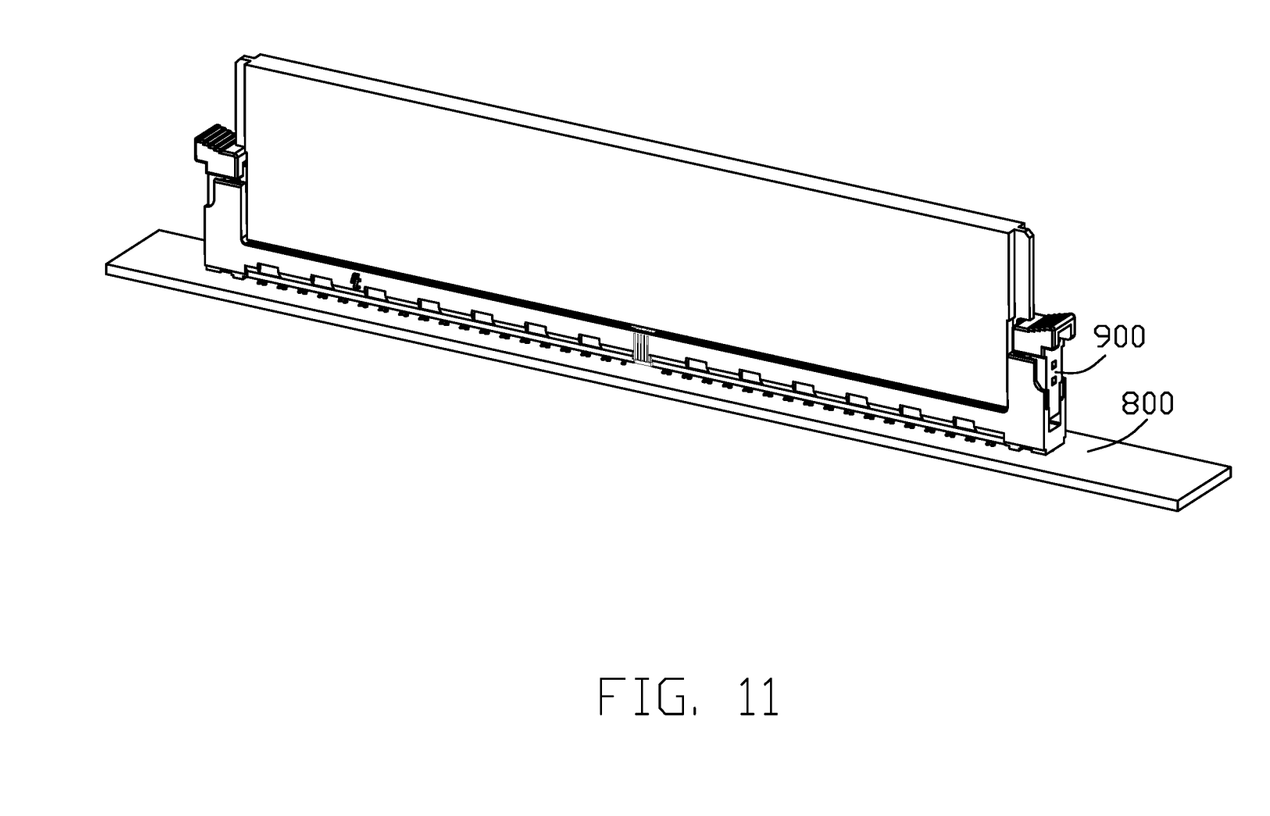
FIG. 11 a perspective view of a card edge connector mounted on a circuit board and with a card module received in the card edge connector according to a third embodiment of the present invention.
Figure 12:
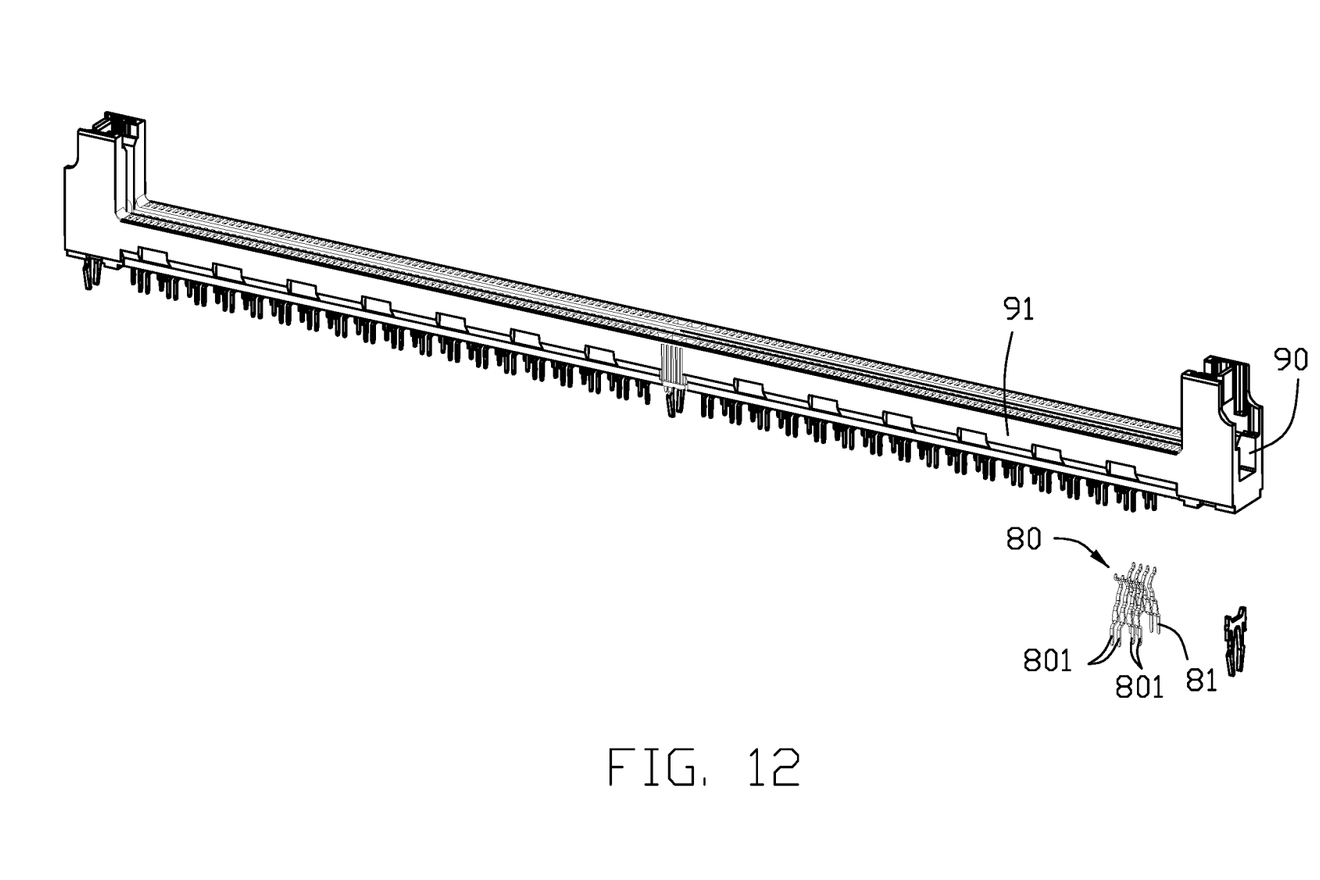
FIG. 12. is an exploded perspective view of the card edge connector of FIG. 11.
Figure 13:
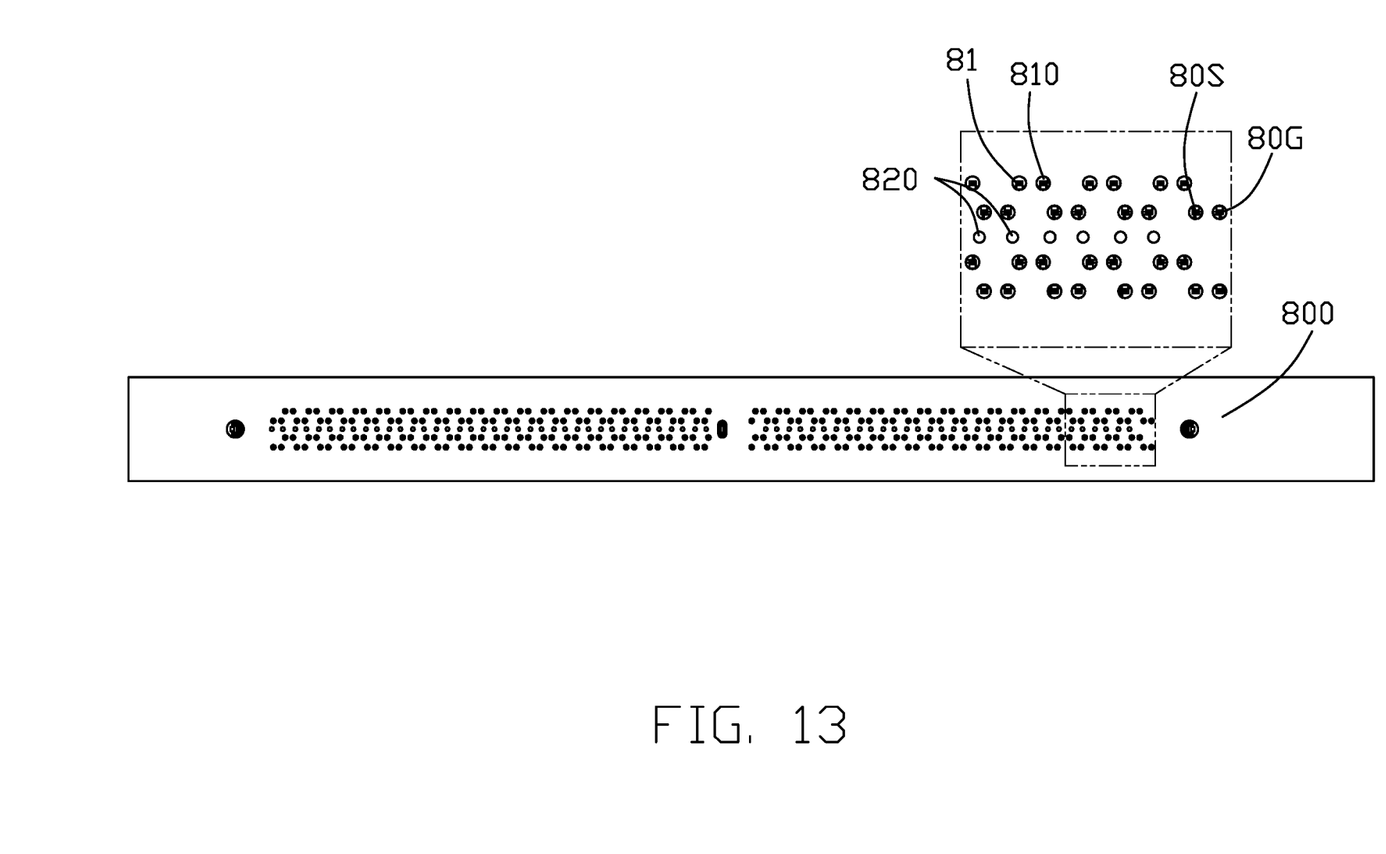
FIG. 13. is a perspective view of the terminals mounted on the circuit board according to a third embodiment of the present invention.

Referring to FIGS. 11-13, a card edge connector 900 of the third embodiment is basically as same as the card edge connector 100 of the first embodiment, which is soldered on a circuit board (PCB) 800. The card edge connector 900 includes a longitudinal insulative housing 90 and two rows of terminals 80. The insulative housing 90 includes two side walls 91 extending in the longitudinal direction. the terminals 80 of each row are fixed in the corresponding side wall 91 and includes a plurality of signal terminals 80S and a plurality of grounding terminals 80G. The terminal 80 includes a soldering portion 81 for soldering on the circuit board 800, and the soldering portion 81 is a pin-shaped structure. Two adjacent terminals 80 in each row are defined as a terminal pair 801. The two soldering portions 81 of each terminal pair 801 are aligned with each other in the longitudinal direction, while the soldering portions of the adjacent terminal pairs 801 are deviate from each other in the longitudinal direction, so that the soldering portions 81 of the two rows of the terminals are arranged in four rows. The circuit board 800 provides four rows of first holes 810 for the four rows of corresponding solder portions 81 to pass through, a row of second holes 820 is added between every two rows of first holes 810 on the circuit board 800. The second holes 820 are locate between the two rows of terminals 80 on the circuit board 800 and penetrate through the upper and lower surfaces of the circuit board 800. The second holes 820 can reduce the crosstalk between the two rows of terminals 80 and enhance the high frequency performance. In the preferred embodiment, the inner diameter of the first hole 810 is 0.54 mm. In the preferred embodiment, the soldering portions 81 of the terminals 80 are set without offset which is consistent with the first embodiment. In other embodiments, the soldering portions 81 can also be offset, for example, like the second embodiment.

Understandingly, the terminals can be of a first arrangement that each row of terminals are composed of a plurality of first terminal pairs each pair consisting of a signal terminal and a grounding terminal adjacent to each other. the terminals alternatively can be of a second arrangement that most of the terminals are in the form of first terminal pairs each consists of a signal terminal and a ground terminal adjacent to each other, and the rest comprise second terminal pairs 201b each consists of two adjacent signal terminals or two adjacent grounding terminals and some single terminals. The terminals alternatively can be of a third arrangement that most of the terminal are arranged in the form of a plurality of first terminal pairs the rest of the terminals are each of single terminals. In the above arrangements, the soldering portions of the grounding terminal 20G are placed next to the soldering portions of the signal terminal 20S in the closest way, which can effectively reduce the crosstalk during signal transmission and improve the high-frequency performance of the pin-shaped structure of the soldering portions 23. Meanwhile, the cost is lower than the solder portions of SMT, which is beneficial for customers to manufacture and put into use on a large scale.

While a preferred embodiment in accordance with the present disclosure has been shown and described, equivalent modifications and changes known to persons skilled in the art according to the spirit of the present disclosure are considered within the scope of the present disclosure as described in the appended claims.

What is claimed is:

1. A card edge connector comprising:
a housing comprising two elongate walls and a card slot between the elongate walls;
two rows of terminals arranged on the elongate walls and comprising signal terminals and grounding terminals, each of the signal terminals and the grounding terminals comprising a contacting portion and a soldering portion, the contacting portions of each row of terminals being lined along a longitudinal direction;
wherein the soldering portions of each row of terminals are arranged in two rows and divided into a plurality of soldering pairs each consisting of two adjacent soldering portions aligned with each other in a same row, and most of the plurality of soldering pairs are each made up of a signal terminal and a grounding terminal and remaining soldering pairs are each made up of two signal terminals or two grounding terminals.

2. A card edge connector comprising:
a housing comprising two elongate walls and a card slot between the elongate walls;
two rows of terminals arranged on the elongate walls and comprising signal terminals and grounding terminals, each of the signal terminals and the grounding terminals comprising a contacting portion and a soldering portion, the contacting portions of each row of terminals being lined along a longitudinal direction;
wherein each row of terminals comprises a plurality of terminal pairs, the soldering portions of each terminal pair are aligned with each other along the longitudinal direction and the soldering portions of an adjacent terminal pair are offset in the longitudinal direction so that the soldering portions are in four rows, and a majority of the plurality of terminal pairs each consists of a signal terminal and a grounding terminal and a remainder of the plurality of terminal pairs each consists of two grounding terminals or two signal terminals.

* * * * *